United States Patent
Yang et al.

(10) Patent No.: US 7,155,376 B2
(45) Date of Patent: Dec. 26, 2006

(54) TRAFFIC DATA MANAGEMENT AND SIMULATION SYSTEM

(75) Inventors: Qi Yang, Mclean, VA (US); Howard Slavin, Newton, MA (US); Kjartan Stefansson, Arlington, MA (US); Andres Rabinowicz, Newton, MA (US); Simon Olsberg, Newton, MA (US); Mary LaClair, Cambridge, MA (US); Jonathan Brandon, Newton Centre, MA (US)

(73) Assignee: Caliper Corporation, Newton, MA (US)

( * ) Notice: Subject to any disclaimer, the term of this patent is extended or adjusted under 35 U.S.C. 154(b) by 509 days.

(21) Appl. No.: 10/179,643

(22) Filed: Jun. 24, 2002

(65) Prior Publication Data

US 2002/0198694 A1 Dec. 26, 2002

Related U.S. Application Data

(60) Provisional application No. 60/300,197, filed on Jun. 22, 2001.

(51) Int. Cl.
G06G 7/48 (2006.01)

(52) U.S. Cl. .......................... 703/8; 701/200; 701/201; 701/207; 707/104.1

(58) Field of Classification Search ................ 703/8, 703/6; 340/988–996; 701/200, 201; 706/902, 706/913
See application file for complete search history.

(56) References Cited

U.S. PATENT DOCUMENTS

| | | | |
|---|---|---|---|
| 5,381,338 A * | 1/1995 | Wysocki et al. ............ 701/207 |
| 5,798,949 A * | 8/1998 | Kaub ............................. 703/6 |
| 5,863,203 A | 1/1999 | Bragdon | |
| 6,261,100 B1 * | 7/2001 | Bragdon ...................... 434/29 |
| 6,317,686 B1 * | 11/2001 | Ran ............................ 701/210 |
| 6,430,499 B1 * | 8/2002 | Nakano et al. ............. 701/208 |
| 2002/0184236 A1 * | 12/2002 | Donath et al. ........... 707/104.1 |
| 2004/0248583 A1 * | 12/2004 | Satt et al. ................ 455/452.2 |
| 2005/0149251 A1 * | 7/2005 | Donath et al. ............. 701/200 |

OTHER PUBLICATIONS

Claramunt, C.; Peytchev, E.; Bargiela, A.□□A Real-time GIS for the Analysis of a Traffic System□□Sep. 28-Oct. 1, 1999 IEEE□□vol. 1, ISBN: 0-7803-5546-6□□pp. 15-20.*

(Continued)

*Primary Examiner*—Kamini Ohah
*Assistant Examiner*—Cuong Van Luu
(74) *Attorney, Agent, or Firm*—Fish & Neave IP Group of Ropes & Gray LLP; Jeffrey H. Ingerman (57) ABSTRACT

Systems and methods for, inter alia, geographically based analyses of traffic being carried over a wide scale traffic network. The systems integrate geographical information systems (GIS) with traffic simulation processes to allow a user to analyze traffic patterns and loads at specific geographic locations of regions. Additionally, these systems allow for traffic analysis over a wide scale traffic network that may encompass the traffic network that exists within an geographic region and can include, as examples, the traffic networks that span across a city, that interconnect cities, that interconnect states and that run across multiple states. To this end, the systems include traffic simulators that can adaptively or controllably select between multiple traffic simulation models for simulating traffic across different segments of the traffic network. The different models provide varying levels of granularity for measurements of geographical location of a vehicle traveling over the traffic network.

79 Claims, 6 Drawing Sheets

OTHER PUBLICATIONS

Lieberman E. Integrating GIS, Simulation and Animation Dec. 8-11, 1991 Simulation Conference, 1991. Proceedings ISBN: 0-7803-0181-1 pp. 771-775.*

Claramunt, C. et al. a real-time GIS for the analysis of a traffic system. Africon: IEEE 1999, p. 15-20. IEEE Catalog No. 99CH36342.

Holtzman, J. et al. A vehicular traffic GIS and simulator for route guidance on NY/NJ highways. Proc. IEEE-IEE Vehicle Nav. and Info. Sys. Conf., Ottwawa, Canada Oct. 1993, pp. 367-372, IEEE Catalog No. 93CH3285-4.

Kim, K.-H. et al. Managing scheme for 3-dimensional geo-features using XML. IGARSS, Honolulu Jul. 2000, vol. 7, pp. 2899-2901. IEEE Catalog No. 00CH37120.

Lieberman, E. Integrating GIS, simulation and animation. Simulation Conference, Phoenix 1991, pp. 771-775.

Barcelo, J. et al., "Interfacing EMME/2 with AIMSUN2 Microsimulator," First Asian EMME/2 Users' Meeting in Shaghai, P.R. China, Aug. 23-24, 1999.

Bespalko, S. J., et al., "The Need for a Formal GIS Transportation Model," *International Conference and Workshop on Interoperating Geographic Information Systems* (Interop '97), Santa Barbara, California, Dec. 3-6, 1997.

Bloomberg, L. et al., "A Comparison of the VISSIM and CORSIM Traffic Simulation Models On A Congested Network," Submission for Publication in the *Transportation Research Record*, pp. 1-23, Mar. 2000.

Caliper Corporation, *GISDK Geographoc Information System Developer's Kit Programmer's Guide 4.0*, Caliper Corporation, 1998.

Caliper Corporation, *TransCAD Transportation GIS Software User's Guide*, 2000.

Caliper Corporation, *Travel Demand Modeling with TransCAD 4.0*, 2001.

Caliper Corporation, *Routing and Logistics with TransCAD 4.0*, 2002.

Claramunt, C. et al., "A New Framework for the Integration, Analysis and Visulisation of Urban Traffic Data Within Geographic Information Systems," *Transportation Research Part C: Emerging Technologies*, vol. 8, pp. 167-184, Sep. 19, 2000.

Fisher, K.M., "TRANSIMS is Coming!," *Public Roads*, vol. 63, No. 5, Mar./Apr.

Fohl, P. et al., "A Non-Planar, Lane-Based Navigable Data Model for ITS," *Proceedings, 7th International Symposium on Spatial Data Handling*, pp. 7B/17-29, Delft, Aug. 12-16, 1996.

Goodchild, M.F., "Geographic Information Systems and Disaggregate Transportation Modeling," *Geographical Systems* 5(1-2), pp. 19-44, 1998.

Goodchild, M.F., "GIS and Transportation: Status and Challenges," National Center for Geographic Information and Analysis (NCGIA) University of California, Santa Barbara, 1999.

Hatton, C.C., "GIS-T7F: A Geographic Information System-Data Input Module for the Traffic Signal Simulation Model TRANSYT-7F," Thesis presented to The Academic Faculty of Georgia Institute of Technology, Aug. 1991.

Jayakrishnan, R., et al., "Distributed Computing and Simulation in a Traffic Research Test Bed," *Computer-Aided Civil and Infrastructure Engineering* vol. 14, pp. 429-433, 1999.

Lieberman, E., et al., "Traffic Simulation," *Traffic Flow Theory, A State-of-the-Art Report* (N. Gartner et al., eds.), of Turner-Fairbank Highway Research Center, Federal Highway Administration, U.S. Dept. of Transportation, pp. 10-1—10-23, 1997.

Nagel, K., "Low Fidelity Microsimulation of Vehicle Traffic on Supercomputers," *Transportation Research Board*, Paper No. 940901, Jan. 9-13, 1994.

Nagel, K., et al., "The Dynamics of Iterated Transportation Simulations," Submitted to *Transportation Research C*, Feb. 18, 2000 (earlier version presented at the TRIannual Symposium on Transportation Analysis (TRISTAN-III)in San Juan, Puerto Rico).

Oh, J.S., et al., "Mircoscopic Simulation with Large-Network Path Dynamics for Advanced Traffic Management and Information Systems," Institute of Transportation Studies, University of California at Irvine, Dec. 1999.

Owen, L.E., "Traffic Flow Simulation Using Corsim," *Proceedings of the 2000 Winter Simulation Conference* (Jones, J.A., et al., eds.), pp. 1143-1147, 2000.

Poschinger, A., et al., "The Flow Data in Coupled Microscopic Traffic Simulation Models," *From Vision to Reality, Proceedings of the 7th World Congress on Intelligent Transport Systems*, in Turin, Italy, Nov. 6-9, 2000.

Rilett, L.R., et al., "A Comparison of the Low Fidelity TRANSIMS and High Fidelity CORSIM Highway Simulation Models Using its Data," Texas Transportation Institute paper No. 00-0678, Jan. 2000.

Sabra, Z. Dr., "Traffic Analysis Software Tools," *Transportation Reasech Circular*, No. E-CO14, Sep. 2000.

Sarasua, W.A., "Applying GIS Technology to Traffic Signal Coordination," Transportation Research Board Paper No. 940594, Jan. 9-13, 1994.

Slavin, H., "An Integrated, Dynamic Approach to Travel Demand Forecasting," *Transportation*, vol. 23, pp. 313-350, Kluwer Academic Publishers 1996.

Smith, L. et al., "TRANSIMS: Project Summary and Status May 1995," accessed on Nov. 12, 2005 at www.ntl.bts.gov/DOCS/466.html.

Sung, K. et al., "Integration on Macro and Micro Traffic Simulation Analysis by Using Windowing Method," Hanyang University (Japanese with Eglish Translation).

"UNITES Software Announced," KLD Associates, Inc.

*TRANSIMS Travelogue*, Jun. 1995.

Yang, Q., "A Simulation Laboratory for Evaluation of Dynamic Traffic Management Systems," Thesis submitted to the Department of Civil and Environmental Engineering, Massachusette Institute of Technology, Jun. 1997.

Yang, Q., "A Simulation Laboratory for Evaluation of Dynamic Traffic Management Systems," Presentation at the 79th Annual Meeting of Transportation Research Board, TRB Paper No. 00-1688, Nov. 19, 1999.

* cited by examiner

| O | D | FLOW | TIME |
|---|---|------|------|
|   |   |      |      |

TRAFFIC DATA MANAGEMENT AND SIMULATION SYSTEM

CROSS REFERENCE TO RELATED APPLICATIONS

This claims the benefit of U.S. Provisional Patent Application No. 60/300,197, filed Jun. 22, 2001, entitled TRAFFIC DATA MANAGEMENT, ANALYSIS, AND SIMULATION and naming Howard Slavin and Qi Yang as inventors, the contents of which are hereby incorporated by reference.

FIELD OF THE INVENTION

The system and methods described herein relate to traffic analysis and data management systems and modeling methods, and more specifically, to systems and methods that integrate geographic information systems and traffic simulation.

BACKGROUND OF THE INVENTION

Traffic simulation is a useful tool for analyzing traffic flows when designing roads, highways, tunnels, bridges, and other vehicular traffic ways. It can help to answer many "what-if" questions prior to field construction; compare and determine the trade-offs between scenarios such as different network configurations, suitable placements for signs, optimal timing of traffic signals, and the like. By analyzing the flow of vehicles over a road network, a municipality can improve the road network and traffic management to make more effective use of the existing infrastructure and/or accurately project future travel demand and supply shortage, thus plan necessary expansion and improvement of the infrastructure to accommodate growth in traffic.

However, the ability to model traffic flow requires the appropriate analytical systems and techniques for analyzing complex and dynamic systems. Because of the many complex aspects of a traffic system, including driver behavioral considerations, vehicular flow interactions within the network, stochasticity caused by weather effects, traffic accidents, seasonal variation, etc., it has been notoriously difficult to estimate traffic flows over a road network.

There exist traffic simulators for modeling the traffic flow across road networks. Vehicle counts, speeds, and other traffic data over time and various locations are being collected to calibrate and validate the traffic models. The planners and engineers can experiment with these models to analyze how traffic may flow as volume increases, accidents reduce available lanes and other conditions vary.

Although these traffic simulation tools are helpful, they are not easy to use and require a labor intensive process for the preparation of data input and interpretation and analysis of simulation output. Often a user has to spend days preparing the input data to apply to a simulator of a road network. Moreover, the size of the road networks existing simulators can handle, or the level of details these simulators can provide are often limited.

A further drawback to these existing systems is that these models lack accurate geographical representation of network objects. Specifically, many existing systems employ the traditional "links and nodes" graph formulation of traffic network, with each node representing an intersection or a change of traffic characteristics along the road, and each link representing the roadway connecting the two end nodes. The position of nodes and/or links are represented by their 2D Cartesian coordinates of X and Y, and do not necessarily align to their true geographical locations. As a result of the arbitrarily chosen coordination systems, it is often difficult to accurately geocode the survey data, and reference data from different sources. Furthermore, the lack of geographically accurate road network data also results in inaccurate model output because of the errors in measurement of distance and length.

Traffic simulation tools in general are computational demanding because of the complexity involved in modeling traveler behavior and because numerous network objects and vehicles need to be tracked. This is particularly true for the microscopic traffic simulator in which vehicle movements are modeled in detail on a second-by-second basis. On the other hand, some more aggregate models have been developed to simulate large networks, but they do not provide the necessary details in representing the traffic dynamics in modeling traffic signal operations. As a result, neither models may be sufficient for detailed traffic engineering applications of a large scale urban network. However, these congested urban networks are exactly the areas whose severe traffic problems need to be better studied and relieved.

Accordingly, today planners and engineers face significant disadvantages, as current traffic simulation tools do not generally scale to large urban areas in a manner that conserves calculation resources while providing meaningful simulation results. As a further disadvantage, current tools do little to make design and testing easier for users.

SUMMARY OF THE INVENTION

An object of the invention is to provide traffic network database management systems and methods for geocoding road network and storing traffic survey and modeling data.

It is a further object to provide comprehensive traffic simulation systems that provide a network for modeling large scale road networks with variable levels of granularity.

It is an object of the invention to provide a geographical information system (GIS) based graphical tool for editing traffic networks, analyzing and visualizing traffic data (e.g. geocoding, mapping, querying, reporting) and storing large quantities of time varying traffic data.

It is an object of the invention to provide traffic analysis systems that are more facile to use and reduce or eliminate the need to manually prepare input data files for traffic simulation models.

It is a further object of the invention to provide traffic analysis systems that provide a geographical context to information about traffic patterns.

It is a further object of the invention to provide a traffic analysis system that provides for analyzing data and developing data queries about the dynamic behavior of data at specific geographic locations of regions.

Other objects of the invention will, in part, be obvious, and, in part, be shown from the following description of the systems and methods shown herein.

The systems and methods of the invention provide, inter alia, systems that are designed to allow for geographical analyses of traffic flowing over a wide scale road network. Accordingly, the systems described herein integrate geographical information systems (GIS) directly with traffic simulation processes to allow a user to analyze traffic patterns and loads at specific geographic locations of regions. Thus it allows the user to import and utilize existing data on travel demand, road network, and survey data from a wide range of sources. Additionally, the systems include multiple traffic simulation models for simulating traffic across different segments of the traffic network. The different models provide varying levels of granularity for modeling vehicle movements over the traffic network. In other words, different parts of the road network can be designated to use a particular type of traffic simulation model. Thus portions of the traffic network that are to be analyzed more closely can use the traffic simulator model with the highest degree of granularity, while traffic patterns across other areas of the network may be modeled with lower granularity models that may provide for computational efficiency. As will further be described herein, as a vehicle moves from one portion of the traffic network that employs one type of simulation model to another portion of the traffic network that employs a different type of model, the systems described herein alter the model employed to switch the modeling logic used to simulate the behavior of the vehicle to comply with the model logic employed by that portion of the traffic network.

The hybrid modeling techniques and methods described herein allow for analyzing traffic patterns and behavior over a wide scale heterogeneous traffic network that encompasses major highways, arteries, as well as local city streets. Some of the roadways may be associated with a simulation model that provides a lower level of fidelity, based on the focus of the application the availability or data and other modeling resources. Additionally and optionally, footpaths and bikepaths can also be simulated and their effect on traffic flow tested and analyzed.

More specifically, in certain embodiments the invention may be realized as a system for analyzing traffic flow, that includes a geographical information system (GIS) database manager for allowing a user to form spatial queries representative of queries formed from at least one spatial characteristic, a GIS database having a network representation of a transportation environment and being responsive to the GIS database manager for processing said spatial queries, a traffic simulator for simulating, as a function of the network representation, a flow of traffic across the transportation environment, and a database interface responsive to said traffic simulator for processing simulation data and for creating GIS data representative of time varying traffic data and for modifying demand data stored in said GIS database.

BRIEF DESCRIPTION OF THE DRAWINGS

The foregoing and other objects and advantages of the invention will be appreciated more fully from the following further description thereof, with reference to the accompanying drawings wherein.

DESCRIPTION OF THE ILLUSTRATED EMBODIMENTS

To provide an overall understanding of the invention, certain illustrative embodiments will now be described, including a traffic simulation system having the ability to simulate large, heterogeneous traffic networks, while at the same time providing detailed output for selected portions of the traffic network. However, it will be understood that the systems and methods are not limited to these particular embodiments and can be adapted and modified for other suitable applications and to provide other types of products and that such other additions and modifications will not depart from the scope hereof.

The systems and methods of the invention provide, among other things, systems that allow for large scale traffic simulation and analysis over a large road network. Additionally, as will be described herein, the systems and methods may provide for a geographical information system (GIS) that cooperates with real world traffic surveillance and control systems to provide dynamically-changing geographical data representative of traffic flow over a traffic network. The GIS system allows for spatial queries of the dynamically changing GIS data model to allow for a dynamic analysis of traffic loads that occur over time across the traffic network. In other words, the systems and methods of invention are generic in the sense that they can be utilized in "off-line" applications where traffic flow and traffic management simulators are used to estimate what would happen in the real world, or in "on-line" applications where all or parts of the components in the system are linked to the real world counterparts.

Existing traffic simulation models typically deal with a particular type of road facilities (e.g. access controlled freeways; or urban streets) and employ single level modeling fidelities (e.g. microscopic simulators based on car following and lane changing models; mesoscopic or macroscopic simulators based on speed vs density or travel time vs flow performance functions). To model a wide area heterogeneous traffic network, certain embodiments of the systems described herein employ a simulator that uses a hybrid model. Vehicle movements can either be simulated in detail using car following, lane changing, and individual driver behavior models, or collectively using the performance functions associated with the road segments. Three types of traffic models, namely microscopic, mesoscopic, and macroscopic models, each simulate traffic flow at a different level of detail and running at different update frequencies (for example, microscopic model may run at 0.1 second intervals; mesoscopic model at 1–2 seconds intervals; while macroscopic model at 5–10 seconds intervals), can be used simultaneously in a single simulation for designated intersections and road segments. This hybrid approach, by using variable level of details for different parts of the network, has the ability to simulate large traffic networks, while at the same time providing detailed output for the selected regions of interest. The ability to model large networks makes it possible to apply simulation studies to real world traffic network problems and obtain more accurate and system wide performance measures; on the other hand, allowing microscopic traffic simulation for a selected subset of the network provides modelers with the tools to conduct detailed and dynamic traffic applications in much broader network settings, therefore the impact on and from the entire system can be addressed.

Figure 1:
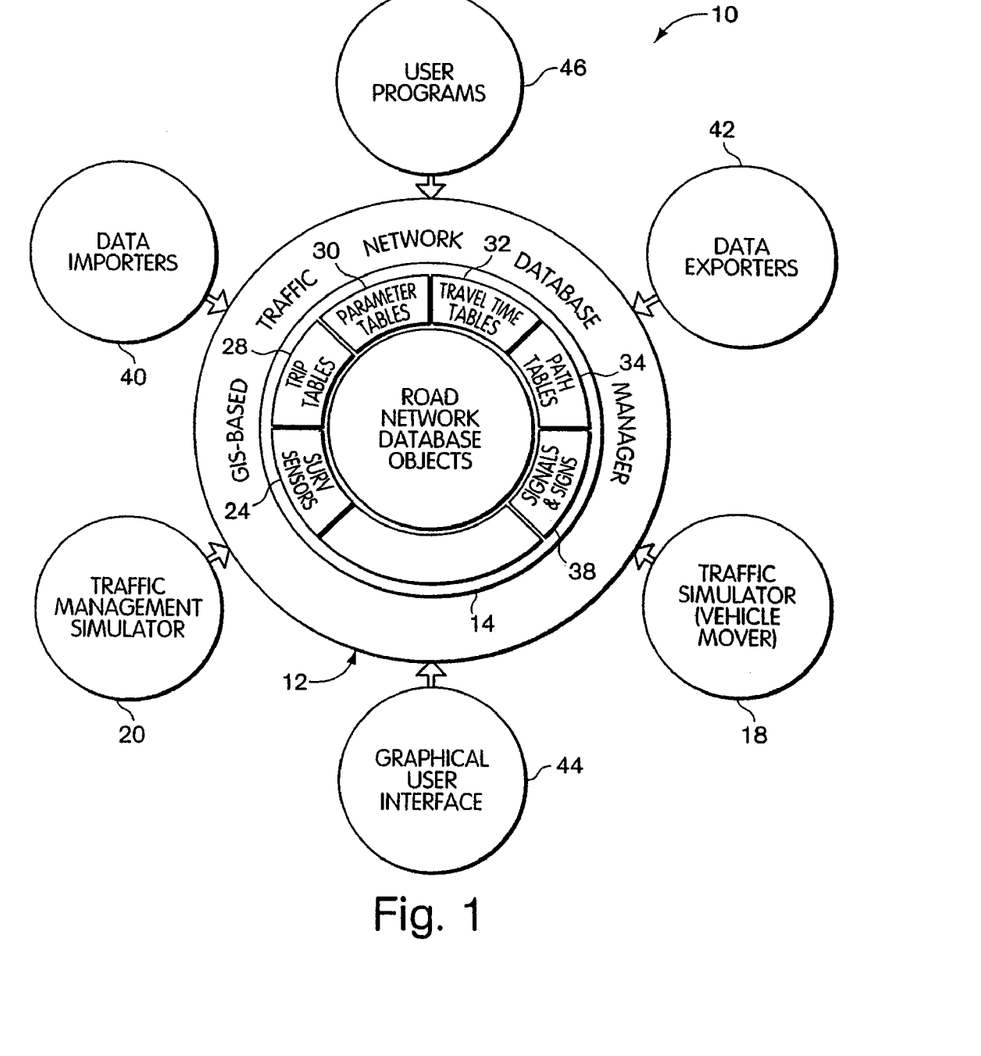
FIG. 1 depicts pictorially the structure of one system according to the invention.

FIG. 1 depicts a first system according to the invention. Specifically, FIG. 1 depicts a system 10 that includes GIS database manager 12, a GIS database 14, a traffic simulator 18, and a traffic management simulator 20. As further shown in FIG. 1 the GIS database 14 can optionally include a plurality of different elements and tables including the depicted survey sensors 24, the trip tables 28, the parameter tables 30, the travel tables 32, the path tables 34 and the signals and signs data record 38. Additionally, FIG. 1 shows an embodiment wherein several optional features can be connected into communication with the database manager 12. Specifically, FIG. 1 depicts the data importers 40, data exporters 42, graphical user interface 44 and user programs 46 that can interface with system 10 depending upon the application at hand. As shown, at the core of the system 10 is a GIS-based traffic network database 14 which may contain the records of hierarchically organized road network objects, including nodes (intersections), links (roads connecting intersections), segments (sections of links each has uniform traffic attributes), lanes, and toll plazas; an inventory of traffic surveillance sensors, signals, and signs; trip tables that represent time-variant travel demands between various origin-destination (OD) pairs; path tables that explicitly list the routes habitually taken, or models and rules that determine such routes; parameter tables that represent traffic characteristics and travel behavior; and travel time tables that describe the perceived historical and real-time travel time in the network.

In one embodiment each network object is assigned a unique ID, and if applicable, a geographical object and/or a relative position indicator to represent its physical position. For example, each segment, representing a particular directional road section, owns (or shares with the segment on the opposite direction) one or two geocoded line objects that represent the left curb (or center of two-way street) and right curb of the roadway (line for the right curb is made optional, and, if not explicitly coded, will be computed based the left line and lane alignments). The line objects can either be polylines or curve of various types. Shape points representing the line objects store differential values of coordinates in longitude, latitude, and altitude to compress the data size and improve the accuracy. Traffic sensors, signals, and signs can be either referenced to their relative positions in segments that contain the objects, or explicitly coded with geographical objects of points, lines, or areas. The hierarchical relationships between various types of network objects are implemented as sets. Each set has an owner and one or more members. For example, the upstream and downstream links connected to a node are represented by two sets owned by the node. Similarly, sensors, traffic signals, and signs in a particular segments may also be represented by sets.

In one embodiment attributes associated with a particular type of network object are implemented in data tables as part of the network database or external data files maintained by a user's application module. The unique ID, automatically assigned and maintained by GIS DBM 12 to each network object that needs external reference, is employed to join the attribute tables to topologically organized and geographically coded objects. Separating attribute data, both static and time-variant, from the core road network database, improves the stability as well as the usability of the database. For example, in simulating traffic operations under two different weather conditions, the user does not have to modify the core road network database; he/she only needs to join the data tables and choose fields that are related to weather condition.

The depicted system 10 allows the user to perform a geographical analysis of traffic flows over a wide scale traffic network and in variable level of detail. The GIS-based traffic network database manager 12 (GIS DBM) is provided to support spatial queries of the objects in the database 14. Stored in the GIS database 14, in one embodiment, is a quad key, data representative of indexing by geographical coordinates of the network objects such as nodes and links. Any network objects can be fast searched by geographical location(s) and their attribute values tabulated or mapped using the provided GIS front-end.

The GIS DBM 12 also allows a user to create spatial queries that identify a subset of data satisfying the parameters laid out in the spatial query. Accordingly, a user may employ the GIS DBM 12 to query the GIS database 14 and joined attribute tables to identify and process the traffic variables such as flows, average speed and delays at specific locations on the traffic network. For example, in analyzing a modification to the road network (e.g. adding a lane to particular sections, designate a commuting freeway to high occupancy vehicles only) or a new traffic signal timing plan, the communities may be interested in knowing the changes in travel delay at different parts of the network, between different origin-destination pairs, and/or different types of travelers. An example query be "Find all the roads with high levels of congestion between 8:10 and 8:20 that are within 2 miles of Washington's Monument". As the system 10 employs a road network representation that is indexed by geographical coordinates, the geographical coordinates of the road network may be processed along with the geographical coordinates of a landmark database to identify roads within 2 miles of the landmark of interest. Thus, by indexing through geographical coordinates of the network objects such as nodes and links, any network object can be fast searched by geographical location(s) and their attribute values tabulated or mapped using the provided GIS front-end. This extendable feature of traffic network database by joining the core network database with external attribute tables, and employing the quad key based GIS search engine, provides flexibility in managing the complex array of traffic data. Although the above example describes the joining of a landmark database, with the network database, it will be apparent to those of skill in the art that other databases may be joined, including census tract databases, zoning databases, weather databases showing moving storms and changing weather conditions, or any other databases that can be indexed by geographical data. As described next, adding the traffic simulator data to the database allows the system 10 to also provide traffic data as a function of physical location.

As shown in FIG. 1, the system 10 includes a traffic simulator 18 that communicates with the GIS DBM 12. The traffic simulator 18, as will be described in greater detail hereinafter, is capable of simulating traffic flow across the road network. The interface between the traffic simulator 18 and the GIS DBM 12 allows the system 10 to receive simulated traffic data from the traffic simulator 18 and update the appropriate data records linked to database 14. By periodically updating the travel demand either using a time-variant trip table or using a dynamic OD flow estimation module, the system 10 is capable of modeling dynamically changing traffic flow across the traffic network. As will further be described hereinafter, the system also includes a traffic management simulator 20 that couples with the GIS DBM 12. The traffic management simulator 20 is a process that represents how traffic signals and signs operate over time and what real time traffic information, if any, is provided to the simulated travelers in the network. Thus continuing with our example, the system 10 can respond to the example query be "Find all the roads with high levels of congestion between 8:10 and 8:20 that are within 2 miles of Washington's Monument", by determining traffic volumes between 8:10 and 8:20 for the roadways that are within 2 miles of the relevant landmark.

In one embodiment, the GIS DBM 12 can be a database manager of the type of commonly employed for allowing a user to generate queries that can be applied to a database to identify a subset of information within that database that satisfies the parameters laid out in the queries. In the system 10 depicted in FIG. 1, the GIS DBM 12 is a GIS based traffic network database manager. To this end, the GIS based traffic network database manager 12 is capable of allowing a user to generate spatial queries that can seek for relationships within geographical data stared within the database 14. Thus, the GIS DBM 12 can apply spatial queries to the GIS database to collect information about a location, a region, or a plurality of locations and regions. It will be understood by those of ordinary skill in the art that this GIS DBM 12 provides a powerful user interface that facilitates the analysis of traffic data at a particular location or over a particular region.

Through the depicted importer 40 and exporter 42 modules, the GIS DBM 12 may exchange data with any other suitable GIS database manager system, including the ARC-VIEW system, the TRANSCAD system produced and sold by the assignee, or the MAP INFO system. Additionally, proprietary GIS database manager systems may be employed. It is advantageous, although not necessary, to employ a GIS DBM system that follows industry standards for formatting GIS data as this allows the system 10 to more easily import data, through data importer 40, into the GIS database, thus, allowing the system 10 to leverage existing GIS databases.

In certain preferred embodiments, the system 10 employs an extended geographic information systems (GIS) technology to facilitate the management, analysis, and simulation of traffic data from road networks. Information such a traffic intersection characteristics, lane configurations and connections, and traffic signal settings can all be managed in a GIS environment and can be represented with a high degree of geographical accuracy.

Optionally, the system 10 includes tools for converting and extending conventional GIS line data and planning network data into a more geographically accurate road network suitable for storage of dynamic traffic data and simulation of traffic flows. This provides schematic representations of transportation features that are geographically accurate and that can be created from existing GIS data files. Polylines of shape points and geometric curves are used to represent the road network accurately. Geographic editing tools can be used to change the network rapidly and easily. The lanes and their geography are generated dynamically if necessary (i.e. the part of network is simulated using microscopic model) and the default lane alignment (represented as lane connectors) are created based on geography of the roads connected to an intersection. Optionally, a geographic polygon overlay process may be employed to compute display regions for underpasses and overpasses. Polygon overlay is a process that identifies the areas of intersections of polygons; when combined with elevation information, it can be determined which portions of the roadway are on top of other roads and thus the visibility region for the traffic simulation can be automatically computed and utilized. This provides for animations that are more realistic as they can show vehicles moving in and out of view as they pass under overpasses or bridges. As will be described next, one advantage of the systems and methods described herein is that they provide for more realistic animations of the traffic flow over a road network.

Figure 2:
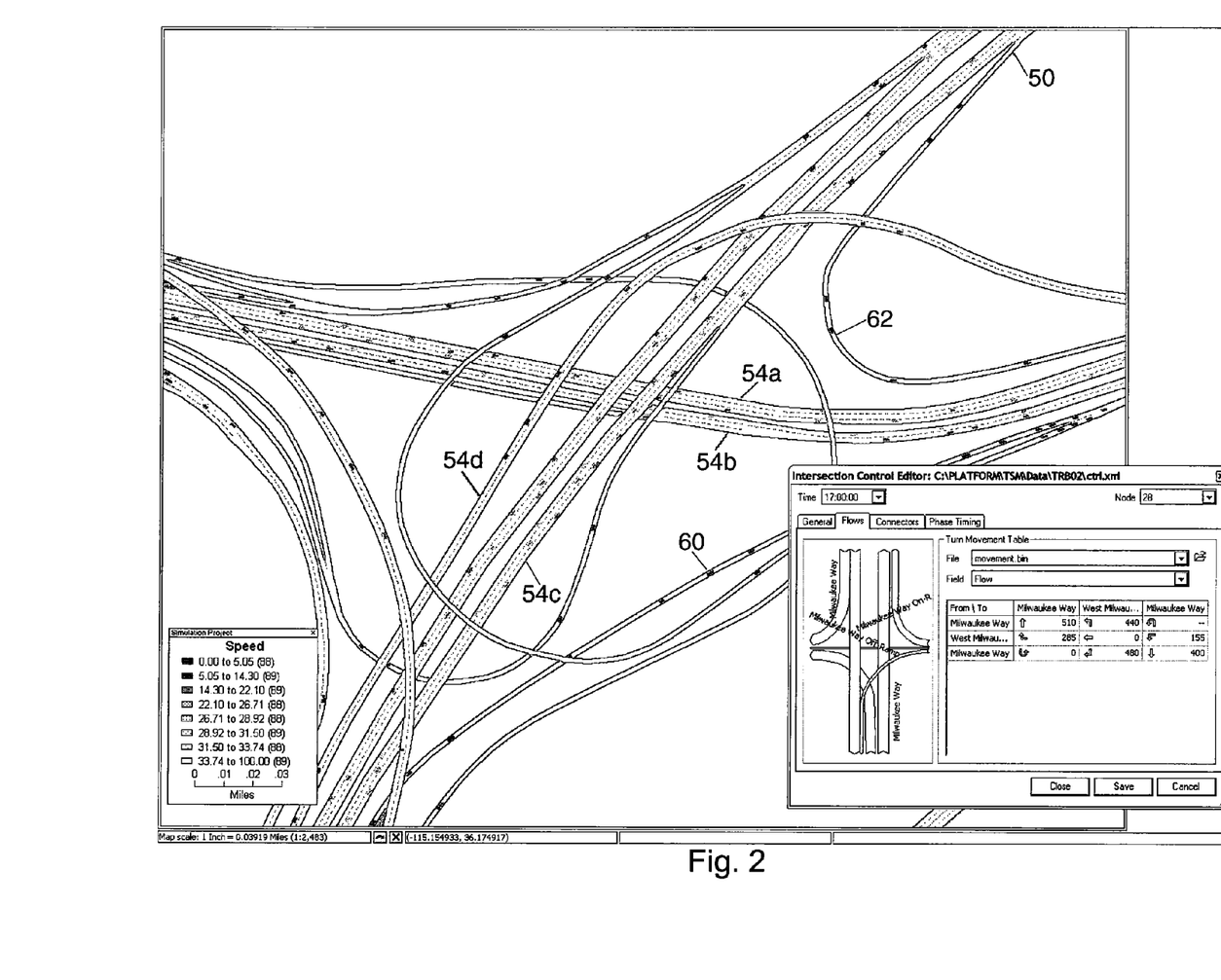
FIG. 2 depicts an example of an output graphic presented by a system such as the system depicted in FIG. 1.

Turning to FIG. 2, one graphical depiction of a traffic network carrying a defined traffic flow is depicted. Specifically, FIG. 2 depicts a traffic network 50 and a vehicular flow that is carried across that network 50. As shown in FIG. 2, the traffic network 50 is depicted to accurately represent the geographical positioning of that network. Thus for example, the traffic network 50 includes geographical information that allows the system 10, through the graphical user interface 44 to depict the actual shape and pattern of the traffic network, including the loops, turns, and curves that are actually present in the actual roadway. Additionally, as depicted, the GIS database 14 can include a network representation of the roadway 50 that includes elevation information representative of the elevation of the roadway at different points across the landscape. This allows the vehicles traveling on one roadway, such as roadway 54*a*, to appear to travel under another roadway, such as roadway 54*c*. It will be understood that the system 10 further may provide the geographic coordinates of each vehicle moving across the roadways depicted in FIG. 2.

FIG. 2 further depicts that the traffic network 50 comprises different types of roadways. For example, the traffic network 50 includes major arteries 54*a*, 54*b*, 54*c* and 54*d*. Additionally, the depicted network 50 includes smaller roadways 60 and on ramps and exit ramps 62.

Accordingly, it will be understood that in certain embodiments system 10 may include a graphical user interface 44 that is capable of depicting a representation, and optionally an animated representation, of a traffic network that is geographically accurate in its depiction of how the roadway lays out over the landscape. Additionally, it will be understood that the graphical user interface 44 can depict traffic flow data stored in the GIS database 14 generated, at least in part, by the traffic simulator process 18. In certain embodiments the graphical user interface 44 continuously updates, such as every tenth of second, the depiction of traffic flow across the road network, thereby providing a dynamic and changing image of traffic flow across the traffic network 50.

Returning to FIG. 1 it can be seen that the traffic simulator 18 is represented as process that is in communication with the GIS DBM 12. The traffic simulator 18 may be any suitable traffic simulator capable of modeling the flow of traffic across a roadway.

One example of a traffic simulator is described in U.S. Pat. No. 5,822,712 that discloses one traffic simulation process of the type that may be employed with the systems and methods described herein. In the simulation process described in this patent, road sensors are employed to collect data about the actual traffic patterns a particular road supports. As described therein, sensors in the road network register the passage of vehicles and any two of the three fundamental traffic flow parameters: density, speed, and flow. The correlation between the traffic at a point X at a certain time and the traffic at another point Y some period later can in certain cases and under certain conditions provide good values. In these cases, the traffic can also be predicted with good precision. Other traffic simulators may be employed with the systems and methods described herein, and the simulator employed may vary according to the application at hand. As will be described below, one traffic simulator 18 that can be employed herewith, will be responsive to information within the GIS database, and will select the logic model employed for simulating vehicle movement across the network bases, at least in part, on information stored in the database.

Figure 3A:
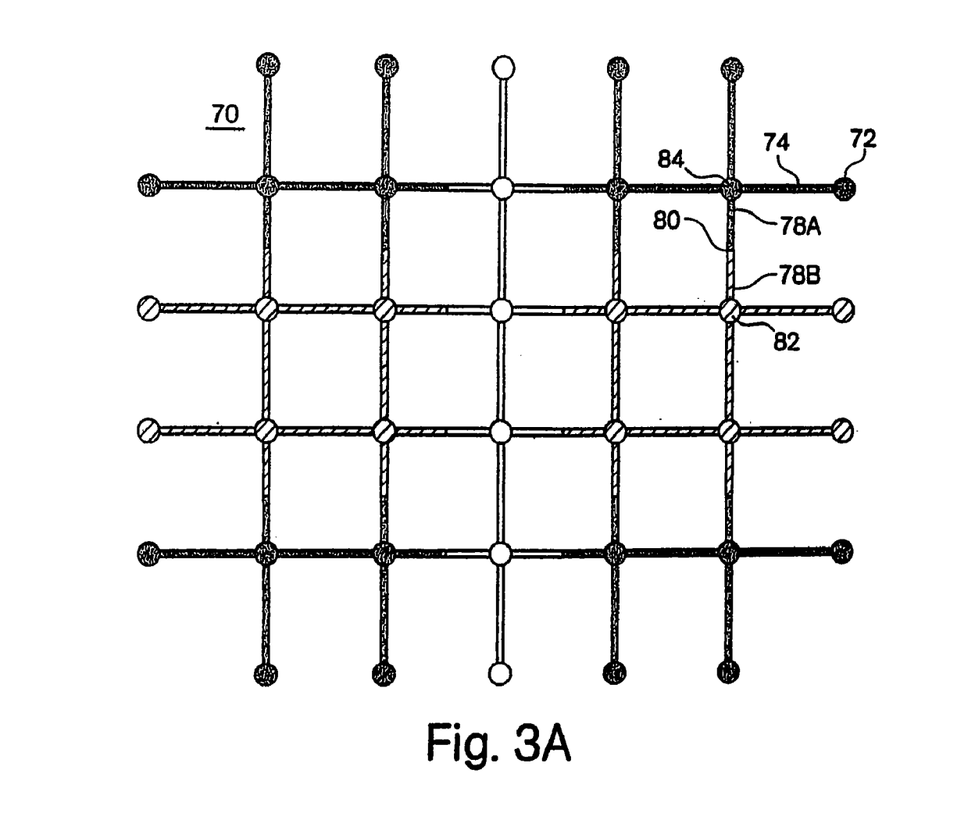
FIGS. 3A–3C depict pictorially a network representation of a transportation environment.

For example, FIG. 3A depicts how network information may be represented in one embodiment of the invention, as a representation with nodes, links, segments, lanes, and optionally other features. As discussed above, the network representation allows the simulation of traffic operations in integrated networks of freeways and urban streets. The data that describes the network is read from a network database file, which can be created using an interactive graphical editor. The network database includes description of all network objects, such as, but not being limited to, lane connections (which lanes of one road connect to which lanes of a connecting road), lane use privilege, regulation of turning movements at intersections (no left turns, for example), traffic sensors, control devices, and toll plazas.

Figure 3B:
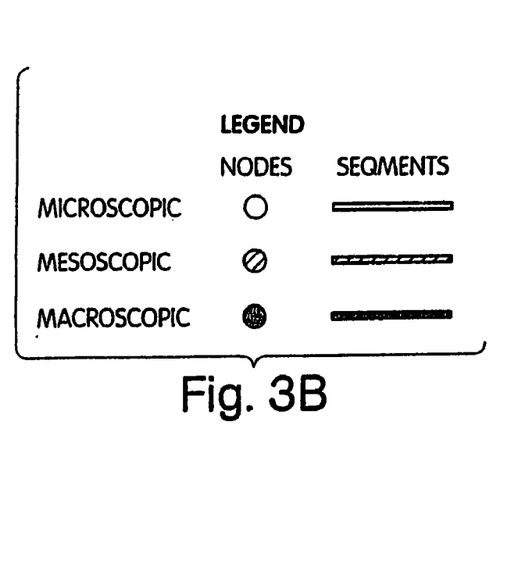

More particularly, FIG. 3A depicts a road-network of the type that may be stored within the database 14 depicted in FIG. 1. As shown in FIG. 3A the links and nodes lay out the different paths and connections that exist within the road network being modeled. As will be known to those of ordinary skill in the art a node may represent an intersection of several roadways or an origin and/or destination where traffic flow enters or leaves the road network. Similarly, a link may be understood as a directional roadway that connects nodes. As shown in FIG. 3A the network representation 70 may include links, such a the depicted link 80, that may be divided into two segments, such as the depicted segments 78A and 78B. A segment, in one practice, may be understood to encompass a road section with uniform geometric characteristics. As further shown in FIG. 3A the link 80 is divided into two equal segments 78A and 78B with one segment connected to a first node 82 and with the other segment 78A connected to the other node 84. However, the way links are divided may vary according to the application. FIG. 3B illustrates that different portions of the network representation 70 may be associated with different traffic simulation logic. Thus as discussed above, different simulation logic may be applied by the traffic simulator 18 to vehicles moving across different portions of the network. This is illustrated in part by FIG. 3B that presents a legend wherein, in this embodiment, three different types of travel logic, microscopic, mesoscopic and macroscopic are employed. In other embodiments, two models may be employed instead of three and in other embodiments, more than three models may be available. The actual models and the number of models can vary depending upon the application, and the systems and methods described herein are not to be limited to any specific models or number of models.

Thus, the network representation 70 may have different links, nodes and segments associated with different kinds of model logic. As will be described in greater detail with reference to FIG. 5, vehicles moving across different segments may be simulated with different logic models depending on which segment, node or link the vehicle is traveling through. By providing different models, information about vehicle flow may be modeled with different levels of grainularity at different locations on the network. Thus, continuing with the earlier example of an example query be "Find all the roads with high levels of congestion between 8:10 and 8:20 that are within 2 miles of Washington's Monument", it may be that once the roadways are determined, the user may, by using the graphical user interface 44, select the portion of the network 70 that represents those congested roadways, with the model logic that provides the highest level of detail. Other portions of the network 70 may be modeled with logic that provides less detail but that is less computationally demanding.

Figure 3C:
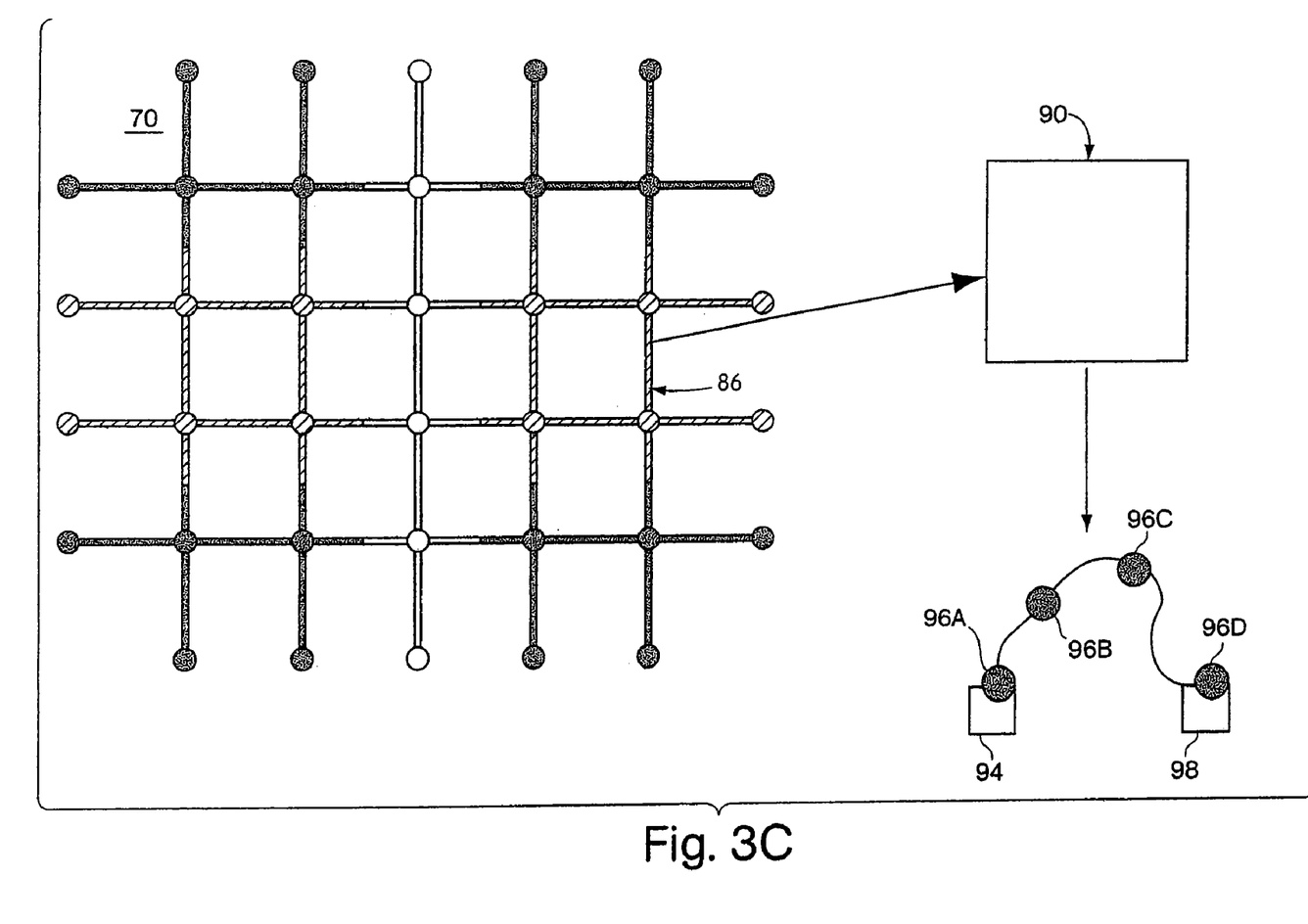

FIG. 3C illustrates that a link, such as the depicted link 86 may map to a data table 90. Specifically, as described above the network representation 70 may include geographical coordinate information for associating the network representation 70 with geographical coordinates that correspond to geographical coordinates of the actual road network being modeled. To this end, each link, node, or segment may be associated with a set of shape points wherein each shape point may provide geographically coordinate data. Thus FIG. 3C depicts that the link 86 may map with the data table 90 that includes information including the origin 94 and destination 98 of that link 86 as well as a plurality of shape points 96A through 96D that represent actual coordinates, such as GPS coordinates that include longitude, latitude and altitude, that can be associated with the link 86. Thus, the network representation of the transportation environment may be geocoded, which as those of skill in the art understand, includes, but is not limited to, a process of matching records in one database, such as address information, with map position reference data in another database.

Figure 4A:
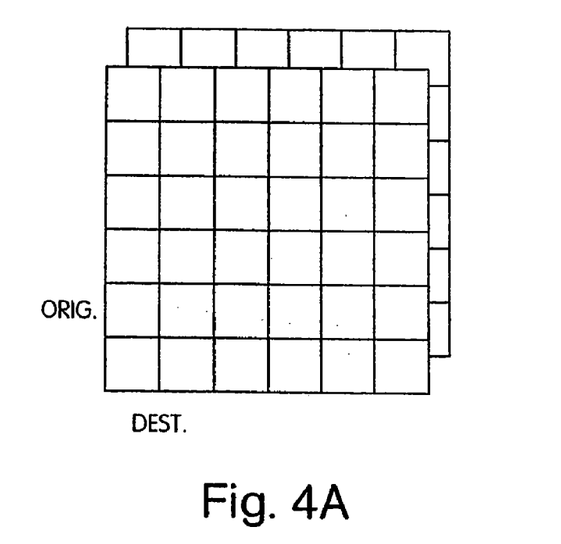
FIGS. 4A–4C depicts an origin/destination table of the type suitable for use with the system depicted in FIG. 1.
Figure 4B:
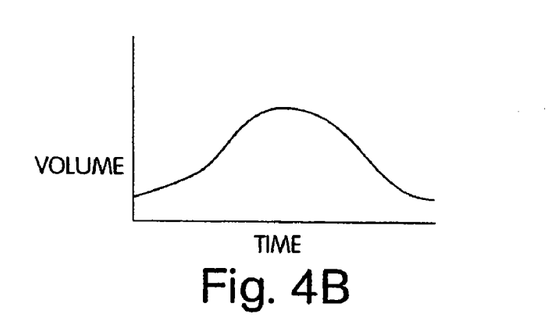
Figure 4C:
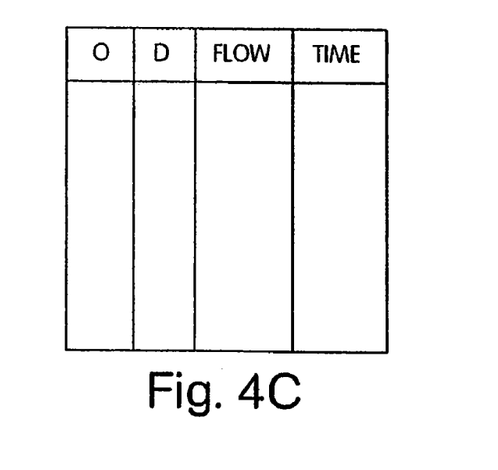

Along with the network representation 70, the GIS database 14 may include information representative of the demand of traffic that flows across the road network. FIG. 4A depicts a plurality of origin and destination tables. An origin and destination table may be set up for automobiles, a separate one for trucks, a separate one for vehicles traveling on a high occupancy vehicle rain, bicycles, or for any other objects moving across the road network. As shown in FIG. 4A, the origin and destination table, in this embodiment, comprises a matrix wherein the set of possible origins is laid out along the Y axis and the set of possible destinations is laid out across the X axis. At each point within the matrix depicted in FIG. 4A, a value representative of the flow occurring between that origin and destination may be provided. The flow may represent the actual volume of cars, trucks or whatever is being modeled, at a particular time. To determine the volume information the system may employ, as depicted in FIG. 4B as statistical analysis that employs an algorithm to generate a flow list, FIG. 4C, that shows how the volume of traffic varies. Specifically, FIG. 4B depicts graphically how the volume of traffic varies over the course of an hour. Specifically, employing algorithms known in the art, the flow of traffic from an origin to a destination may be modeled possibly through the use of earlier collected and periodical data, to determine the volume of flow at any particular time during the course of any hour, day, or some other period. This information may then be provided into a traffic flow list, such as the depicted traffic list FIG. 4C that provides a list of the volume of flow that occurs between each origin and destination at each time. As time varies, the information in the origin and destination tables depicted in FIG. 4A may be updated so that vehicle movement across the road network may be modeled dynamically.

In one embodiment, the system specifies, as shown in FIG. 3A, at the node (intersections) layer what logic is applied to simulate vehicle movement. In one embodiment, one of three types of traffic simulation logic can be designated to individual nodes:

Microscopic: Movements of individual vehicles are modeled in finest level of detail based on car-following and lane-changing logic. Location of vehicle is tracked in detail (x and y-position in a lane).

Mesoscopic: Vehicles are collected and modeled as traffic streams. Their movements are based on speed-density functions. Only the approximate positions (x-position in a road segment) are tracked.

Macroscopic: Aggregated delay function is used to estimate the average time vehicles travel a link or intersection. No details of vehicle positions modeled. Only the entry time into the link or node is tracked.

Figure 5:
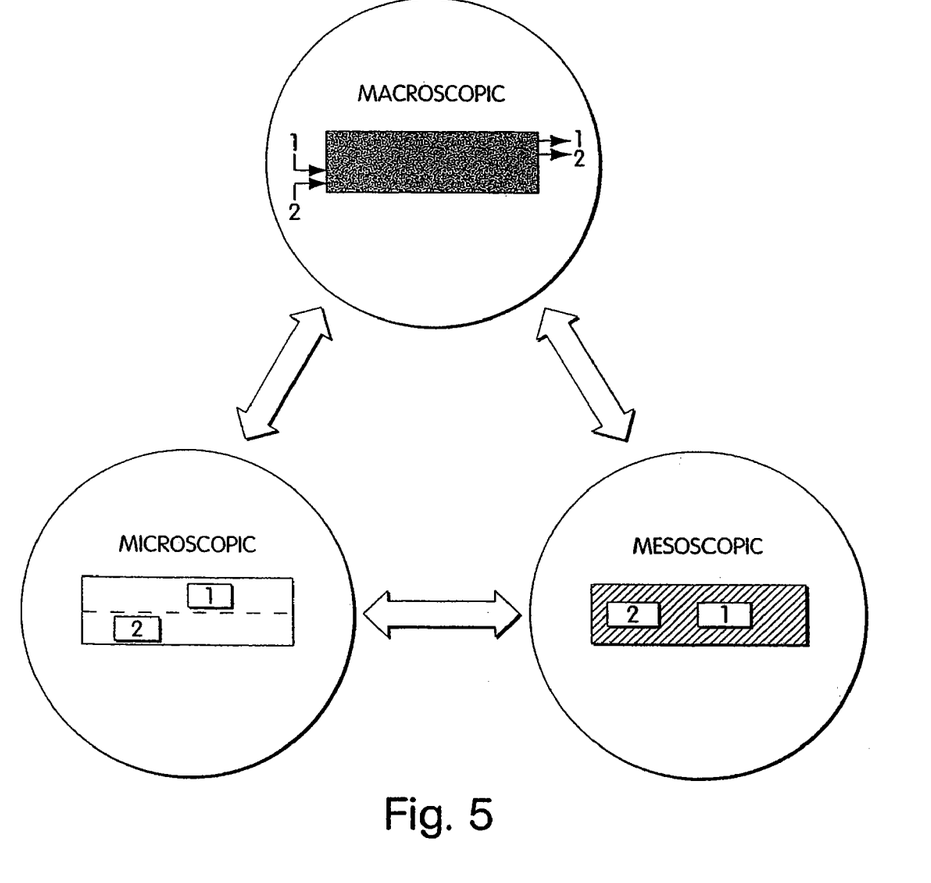
FIG. 5 depicts pictorially the transition between three different types of traffic simulation models that may be employed with the system depicted in FIG. 1.

The user can create a selection set of nodes, which do not have to be connected neighbors, and designate these nodes to a particular type. Creation of vehicle objects and their movements in a specific segment or intersection are based on appropriate logic associated to the type of the node or segment. The road segments connected to a node inherit the type of that node. FIG. 5 illustrates one practice for handling vehicles as they move from one portion of the network 70 being modeled with one type of logic, to another portion of the network 70 being modeled with another type of logic. In this practice, if two nodes of different types are connected by a single link, the link is divided into two segments and each segment inherits its type from the node to which it connects. Three types of transition are defined. These transitions occur between pairs of segments. As shown in FIG. 5, when a vehicle moves into a different type of segment, the "polymorphic" vehicle changes its type but continues to move in the new segment according to the simulation logic assigned to that segment. This method significantly reduces the complexity of "hybrid" traffic simulation, and provides the user with the flexibility of trading off between accuracy and speed, level of detail and availability of data and resources.

Although FIG. 1 depicts the traffic analysis system 10 as functional elements, it will be understood that the system may be realized as a software system executing on a data processing platform that configures the data processor as a system according to the invention. Moreover, although FIG. 1 depicts the system 10 as an integrated unit it will be apparent to those of ordinary skill in the art that this is only one embodiment, and that the invention can be embodied as a plurality of computer programs that can operate on separate or distributed data processing platforms. In fact, the system is designed to be flexible in using multiple processors to work on the same module or each processor works on a different model in a distributed environment. For example, it is not necessary that the database system be hosted on the same system as the traffic simulator or user interface process; multiple processors can be used in traffic flow simulator to conduct the tasks of moving vehicles simultaneously.

As discussed above, the system can be realized as a software component operating on conventional data processing system such as a UNIX workstation. In that embodiment, the system 10 can be implemented as a C language computer program, or a computer program written in any high level language including C++, Fortran, Java or basic. Additionally, in an embodiment where microcontrollers or DSPs are employed, the system 10 can be realized as a computer program written in microcode or written in a high level language and compiled down to microcode that can be executed on the platform employed. The development of such systems is known to those of skill in the art, and such techniques are set forth in Digital Signal Processing Applications with the TMS320 Family, Volumes I, II, and III, Texas Instruments (1990). Additionally, general techniques for high level programming are known, and set forth in, for example, Stephen G. Kochan, Programming in C, Hayden Publishing (1983). It is noted that DSPs are particularly suited for implementing signal processing functions, including preprocessing functions such as image enhancement through adjustments in contrast, edge definition and brightness. Developing code for the DSP and microcontroller systems follows from principles well known in the art.

Those skilled in the art will know or be able to ascertain using no more than routine experimentation, many equivalents to the embodiments and practices described herein.

Accordingly, it will be understood that the invention is not to be limited to the embodiments disclosed herein, but is to be understood from the following claims, which are to be interpreted as broadly as allowed under the law.

We claim:
1. A system for analyzing traffic flow, comprising:
 a GIS database having a geographically accurate lane-level network representation of a transportation environment;
 a GIS database manager for allowing a user to form spatial queries representative of objects in said network, said GIS database being responsive to said CIS database manager for processing said spatial queries;
 a traffic simulator for simulating, at an individual vehicle level, as a function of the network representation, a flow, across the transportation environment, of traffic comprising a plurality of individual vehicles; and
 a database interface responsive to said traffic simulator for processing simulation data and for creating GIS data representative of time-varying traffic data and for modifying demand data stored in said GIS database.

2. A system according to claim 1, further comprising
 an animator process for processing said network representation and said time varying traffic data to generate a visual animation of traffic flow across the transportation environment wherein:
 the lane-level network and individual vehicle objects may be thematically represented with respect to values of traffic data attributes.

3. A system according to claim 1, further comprising an editor for editing the lane-level network representation to create a modified transportation environment.

4. A system according to claim 1, wherein the GIS database includes a network representation having information representative of geographical coordinates of the transportation environment.

5. A system according to claim 1, wherein the lane-level network representation includes a network formed of links, link segments, and nodes, lanes and intersections having accurate geographic shape and placement.

6. A system according to claim 1, further including storage for a segment/node attribute representative of a plurality of traffic simulation models to apply to a portion of the lane-level network representation for simulating movement of one or more vehicles.

7. A system according to claim 6, wherein:
 the lane-level network representation includes a plurality of link segments connected at a plurality of nodes, said system having:
 storage associated with at least one node for storing a segment/node attribute representative of which of said plurality of traffic simulation models to apply during a traffic simulation process to link segments coupled to the respective node.

8. A system according to claim 6, wherein the segment/node attribute may be representative of a microscopic, mesoscopic or macroscopic traffic simulation model.

9. A system according to claim 6, wherein:
 the lane-level network representation includes links, link segments, nodes lanes and intersections having accurate geographic shape and placement; and
 the segment/node attributes are associated with nodes occurring within the lane-level network representation.

10. A system according to claim 6, further including means for associating a segment of the network representation with a selected segment/node attribute.

11. A system according to claim 6, further including means for transitioning between traffic simulation models in response to a vehicle mapped on a first part of the lane-level network representation being mapped to a second part of the lane-level network representation.

12. A system according to claim 1, wherein the lane level network representation of the transportation environment includes storage for data representative of three dimensional world coordinates for accurate shape and elevation.

13. A system according to claim 12, further including a user interface that presents data in a graphical form that employs geographical data in the database to create a geographically accurate graphical representation of the traffic environment.

14. A system according to claim 1, wherein the traffic simulator includes means for simulating behavioral characteristics of drivers of individual vehicles.

15. A system according to claim 1, wherein the traffic simulator includes a route selector for selecting a route for a vehicle to travel to traverse from an origin to a destination.

16. A process for analyzing traffic flow, comprising:
creating a GIS database having information representative of a geographically accurate lane level network representation of a transportation environment and demand data representative of traffic demands placed on the respective transportation environment,
providing a GIs database manager for applying spatial queries to said GIS database representative of object in said lane-level network representation, for identifying traffic demand at selected geographical coordinates; and
simulating, within a single simulation, as a function of (a) time, (b) the lane-level network representation, and (c) the traffic demand information, a flow, across the transportation environment, of traffic comprising a plurality of individual vehicles; thereby:
creating GIS data representative of time varying traffic data, whereby spatial queries can be applied to the GIS database for performing a dynamic analysis of traffic flow.

17. A process according to claim 16, further comprising providing a segment/node attribute with the lane-level network representation to associate one of a plurality of traffic simulation models with at least a portion of the network representation.

18. A process according to claim 16, wherein:
the lane-level network representation includes links, link segments, nodes, lanes and intersections having accurate geographic shape and placement; said process further comprising:
associating a segment/node attribute with a node occurring within the lane-level network representation.

19. A process according to claim 18, further comprising simulating movement of a vehicle across a link segment as a function of a segment/node attribute associated with a node to which the link segment connects.

20. A process according to claim 18, further comprising:
identifying a link that connects between two nodes having different segment/node attributes;
dividing the link into two separate segments, a first segment associated with one segment/node attribute and a second segment associated with another segment/node attribute; wherein:
each segment is associated with a geographical location.

21. A process according to claim 20, further comprising:
monitoring the geographical location of a vehicle and determining when the simulating of a vehicle moves the vehicle from the first segment to the second segment; and
responding to the change in segment/node attribute by changing a traffic simulation model employed to simulate movement of the vehicle.

22. A process for simulating traffic flow across a heterogeneous transportation environment, comprising:
creating a GIS database having information representative of a geographically accurate lane-level network representation of a transportation environment including at least two types of roadways and information representative of traffic demands placed on the respective transportation environment,
associating with a first type of roadways within the network representation a segment/node attribute representative of a traffic simulation models to apply during a traffic simulation process of vehicles moving across the first type of roadways and associating with a second type of roadways a different segment/node attribute to apply during a traffic simulation process of vehicles moving across the second type of roadways,
providing a GIS database manager for applying spatial queries to said GIS database representative of queries formed from at least one spatial characteristic, for identifying traffic demand at selected geographical coordinates,
simulating, within a single simulation, as a function of (a) time, (b) the network representation, (c) the traffic demand information, and (d) the segme/node attributes, a flow of traffic across the transportation environment,
determining when a vehicle from the first type of roadway to the second type of roadway and responding by changing which of said plurality of traffic simulation models is employed to simulate movement of the vehicle; and
updating traffic demand information within the GIS database for creating GIS data representative of time varying traffic data, whereby spatial queries can be applied to the GIS database for performing a dynamic analysis of traffic flow across a heterogeneous transportation environment.

23. A method of traffic simulation, comprising:
applying geographic characteristics to information representative of a transportation environment that encompasses a wide scale traffic network;
applying one of a plurality of traffic simulations at different levels of detail substantially simultaneously to each of a plurality of different portions of the transportation environment within a single simulation, to model traffic flows over a said wide scale traffic network; and
updating a database of traffic demand representative of vehicle-level traffic volume at geographic locations in the transportation environment.

24. A method according to claim 23 wherein traffic data includes information on intersections, road, lanes, traffic signals and signs, surveillance sensors, vehicles, transit, signal timings, historical travel times, and estimates of travel demand.

25. A method according to claim 24, further including providing a database manager for forming spatial queries of traffic network objects and data associated with them.

26. A method according to claim 24, further including joining external data tables of objects to which geographic characteristics have been applied to information, representative of a transportation environment, to which geographic characteristics have been applied.

27. The system according to claim 1 wherein the database interface is further responsive to said traffic simulator for modifying demand data stored in said GIS database.

28. The system according to claim 1 wherein said time-varying traffic data represents intervals of at most 10 seconds.

29. The system according to claim 28 wherein said time-varying traffic data represents intervals of between 5 seconds and 10 seconds.

30. The system according to claim 28 wherein said time-varying traffic data represents intervals of between 1 second and 2 seconds.

31. The system according to claim 28 wherein said time-varying traffic data represents intervals of 0.1 second.

32. The process of claim 16 further comprising updating the traffic demand information within the GIS database.

33. The process of claim 16 wherein said time-varying traffic data represents intervals of at most 10 seconds.

34. The process of claim 33 wherein said time-varying traffic data represents intervals of between 5 seconds and 10 seconds.

35. The process of claim 33 wherein said time-varying traffic data represents intervals of between 1 second and 2 seconds.

36. The process of claim 33 wherein said time-varying traffic data represents intervals of 0.1 second.

37. The process of claim 22 wherein said time-varying traffic data represents intervals of at most 10 seconds.

38. The process of claim 37 wherein said time-varying traffic data represents intervals of between 5 seconds and 10 seconds.

39. The process of claim 38 wherein said time-varying traffic data represents intervals of between 1 second and 2 seconds.

40. The process of claim 38 wherein said time-varying traffic data represents intervals of 0.1 second.

41. A system for analyzing traffic flow, comprising:
a GIS database having a geographically accurate lane-level network representation of a transportation environment, said network representation including representations of a plurality of features; and
a traffic simulator for simulating a flow of traffic across said transportation environment as represented by said network representation; and
an interface for accepting input including selection criteria for selecting among said features; wherein:
said traffic simulator simulates said flow of traffic to a first level of detail for a first subset of said at least some features of said network representation, and substantially simultaneously to at least one other level of detail different from said first level of detail for a second subset of said at least some features of said network representation within a single simulation; and
said first and second subsets are identified based at least in part on said input.

42. A system according to claim 27, further comprising an editor for editing the demand data to create a modified simulation.

43. A traffic simulation system for simulating, at an individual vehicle level, a flow of traffic across a transportation network, said traffic simulation system comprising:
a plurality of traffic simulators, each of said traffic simulators being operable on any portion of said transportation network; wherein:
any combination of at least two of said traffic simulators operates substantially simultaneously on different portions of said transportation network within a single simulation; and
at least a portion of said simulation operates at an individual vehicle level.

44. The traffic simulation system of claim 43 wherein said plurality of traffic simulators comprises a microscopic model, a mesoscopic model and a macroscopic model.

45. The traffic simulation system of claim 44 wherein:
said microscopic model comprises:
vehicle-following logic, and lane-changing logic; and
said microscopic model tracks vehicle location in detail.

46. The traffic simulation system of claim 45 wherein said microscopic model tracks vehicle location to geographic coordinates in a lane.

47. The traffic simulation system of claim 44 wherein:
said mesoscopic model operates on a speed density function; and
said mesoscopic model tracks vehicle location approximately.

48. The traffic simulation system of claim 47 wherein said microscopic model tracks vehicle location to geographic coordinates in a road segment.

49. The traffic simulation system of claim 44 wherein:
said macroscopic model operates on an aggregate delay function; and
said macroscopic model tracks vehicle entry times into one of (a) a link, and (b) a node.

50. The traffic simulation system of claim 43 further comprising:
a user interface for designating nodes and segments of said transportation network as being operated on by a one of said plurality of traffic simulation models; whereby:
a user determines which simulation model operates on any portion of said transportation network.

51. The traffic simulation system of claim 43 wherein different time steps are used to simulate different ones of said portions of said transportation network.

52. The traffic simulator simulation system of claim 43 wherein said transportation network is represented by a geographically accurate lane-level representation of roadways, intersections and vehicle movements.

53. The traffic simulation system of claim 52 wherein said geographic representation comprises three-dimensional real-world geographic coordinates.

54. The traffic simulation system of claim 53 further comprising a geographic information system (GIS) to provide said geographically accurate lane-level representation.

55. The traffic simulation system of claim 53 wherein said geographically accurate lane-level representation in said GIS comprises representations of road segments and connections, lanes, lane widths, lane configurations and connections, traffic controls and elevations.

56. The traffic simulation system of claim 55 wherein said traffic controls are selected from the group consisting of traffic sensors, traffic signals and combinations thereof.

57. The traffic simulation system of claim 55 wherein said geographically accurate lane-level representation in said GIS further comprises control data for said traffic controls.

58. The traffic simulation system of claim 57 wherein said control data comprise timing data.

59. The traffic simulation system of claim 57 wherein said control data comprise settings data.

60. The traffic simulation system of claim 55 wherein said GIS further comprises representations of lane use privileges and turning regulations.

61. A geographic information system (GIS) comprising:
a geographic database comprising geographically accurate representations of road segments and connections, lanes, lane widths, lane configurations and connections, traffic controls and elevations; and
a database manager comprising an interface for querying said geographic database.

62. The GIS of claim 61 wherein said traffic controls are selected from the group consisting of traffic sensors, traffic signals and combinations thereof.

63. The GIS of claim 61 wherein said geographic representation in said GIS further comprises control data for said traffic controls.

64. The GIS of claim 63 wherein said control data comprise timing data.

65. The GIS of claim 63 wherein said control data comprise settings data.

66. The GIS of claim 61 wherein said geographic database further comprises representations of lane use privileges and turning regulations.

67. The GIS of claim 61 wherein said database manager includes a vehicle routing system.

68. The GIS of claim 67 wherein:
said geographic database further comprises representations of vehicle locations; and
said routing system routes vehicles accurately through intersections.

69. The GIS of claim 68 wherein said representations of vehicle locations are time-varying.

70. The GIS of claim 61 wherein said database manager interfaces with a traffic simulation.

71. The GIS of claim 70 wherein:
said geographic database further comprises representations of vehicle locations; and
said traffic simulation simulates the movements of vehicles accurately through intersections.

72. The GIS of claim 61 wherein said geographic database further comprises representations of vehicle locations.

73. The GIS of claim 72 wherein said vehicle locations are stored at lane level and at positions inside intersections.

74. The GIS of claim 73 wherein said vehicle locations are stored as geographic coordinates.

75. The GIS of claim 72 wherein said representations of vehicle locations are time-varying.

76. The GIS of claim 75 wherein said time-varying traffic data represents intervals of at most 10 seconds.

77. The GIS of claim 76 wherein said time-varying traffic data represents intervals of between 5 seconds and 10 seconds.

78. The GIS of claim 76 wherein said time-varying traffic data represents intervals of between 1 second and 2 seconds.

79. The GIS of claim 76 wherein said time-varying traffic data represents intervals of 0.1 second.

* * * * *

UNITED STATES PATENT AND TRADEMARK OFFICE
CERTIFICATE OF CORRECTION

PATENT NO. : 7,155,376 B2
APPLICATION NO. : 10/179643
DATED : December 26, 2006
INVENTOR(S) : Qi Yang et al.

It is certified that error appears in the above-identified patent and that said Letters Patent is hereby corrected as shown below:

Cover page, at Primary Examiner, "Ohah" should be -- Shah --;

Cover page 2, at (56) References Cited, OTHER PUBLICATIONS, in the Barcelo publication, "Shaghai," should be -- Shanghai, --;
    in the first Caliper Corporation publication, "Geographoc" should be
        -- Geographic --; "Kit" should be -- Kit, --
    in the Claramunt publication, "Visulization" should be -- Visualization --;
    in the Fisher publication, "Mar./Apr." should be -- Mar./Apr. 2000 --;
    in the Oh publication, ""Mircoscopic" should be -- "Microscopic --;
    in the Poschinger publication, after "Microscopic" should be inserted -- and Macroscopic --;
    in the Sabra article, "Reasech" should be -- Research --;
    in the Sung publication, "Eglish" should be -- English --;
    in the first Yang publication, "Massachusette" should be -- Massachusetts --.

In FIG. 3B of the drawings, "SEQMENTS" should be -- SEGMENTS --.

Column 5, line 11, "has" should be -- having --;
    line 42, "signs in a" should be -- signs in --.

Column 6, line 17, after "query" should be inserted -- may --;
    line 63, "be" should be deleted.

Column 7, line 2, "of" (second occurrence) should be deleted;
    line 10, "stared" should be -- stored --;
    line 33, "a" should be -- as --.

Column 9, line 21, "a" should be -- as --;
    line 53, "be" should be deleted.

Column 10, line 22, "rain" should be -- lane --.

Column 11, line 36, after "in" should be inserted -- the --;
    line 39, after "on" should be inserted -- a --.

Claim 1, column 12, line 8, "CIS" should be -- GIS --.

Claim 2, column 12, line 18 "comprising" should be -- comprising: --;
    line 20 "time varying" should be -- time-varying --.

Claim 9, column 12, line 56, "nodes" should be -- nodes, --.

UNITED STATES PATENT AND TRADEMARK OFFICE
CERTIFICATE OF CORRECTION

PATENT NO. : 7,155,376 B2
APPLICATION NO. : 10/179643
DATED : December 26, 2006
INVENTOR(S) : Qi Yang et al.

It is certified that error appears in the above-identified patent and that said Letters Patent is hereby corrected as shown below:

Claim 12, column 13, line 3, "representative of" should be -- represented by --.

Claim 16, column 13, line 18, "lane level" should be -- lane-level --;
line 22, "Gls" should be -- GIS --;
line 23, "object" should be -- objects --.

Claim 22, column 14, line 6, "information" should be -- demand data --;
line 8, "environment," should be -- environment --;
line 11, "of a" should be -- of which of a plurality of --;
line 12, "traffic simulation process of" should be -- process of simulating --
line 13, "roadways" should be -- roadways, --;
line 15, "traffic simulation process of"" should be -- process of simulating --;
line 18, "queries" should be -- objects --;
line 19, "formed from at least one spatial characteristic," should be -- in said lane-level network representation, --;
line 21, "coordinates," should be -- coordinates; --
line 25, "environment," should be -- environment; --;
line 26, after "vehicle" should be inserted -- moves --.

Claim 47, column 16, line 9, "speed density" should be -- speed-density --.

Claim 52, column 16, line 32, "simulator" should be deleted.

Signed and Sealed this

Twentieth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 7,155,376 B2 Page 1 of 1
APPLICATION NO. : 10/179643
DATED : December 26, 2006
INVENTOR(S) : Qi Yang et al.

It is certified that error appears in the above-identified patent and that said Letters Patent is hereby corrected as shown below:

Claim 22, column 14, line 8, "environment" should be -- environment; --;
line 24, "segme/node" should be -- segment/node --.

Signed and Sealed this

First Day of July, 2008

JON W. DUDAS
*Director of the United States Patent and Trademark Office*